(12) United States Patent
Haseyama et al.

(10) Patent No.: US 6,191,604 B1
(45) Date of Patent: Feb. 20, 2001

(54) INTEGRATED CIRCUIT TESTING DEVICE

(75) Inventors: Makoto Haseyama; Shigeyuki Maruyama; Naomi Miyaji; Susumu Moriya, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/238,172

(22) Filed: Jan. 28, 1999

(30) Foreign Application Priority Data

Jan. 30, 1998 (JP) .................................................. 10-019644

(51) Int. Cl.[7] .................................................. G01R 31/02
(52) U.S. Cl. .......................................... 324/765; 324/754
(58) Field of Search .................................... 324/765, 764, 324/763, 762, 761, 158.1, 754, 755, 766–769

(56) References Cited

U.S. PATENT DOCUMENTS

| 5,066,907 | * | 11/1991 | Tarzwell et al. | 324/158.1 |
| 5,323,106 | * | 6/1994 | Saegusa | 324/158.1 |
| 5,926,029 | * | 7/1999 | Ference et al. | 324/762 |

FOREIGN PATENT DOCUMENTS 7-335695   12/1995 (JP) .

\* cited by examiner

*Primary Examiner*—Safet Metjahic
*Assistant Examiner*—Jimmy Nguyen
(74) *Attorney, Agent, or Firm*—Armstrong, Westerman, Hattori, McLeland & Naughton

(57) ABSTRACT

An integrated circuit testing device includes a flexible base of an insulating material, the base having a first surface and a second surface opposite to each other, an integrated circuit to be tested being bonded to the first surface. A conductive wiring layer is provided on the first or second surface of the base, the wiring layer including a plurality of projecting contacts over the first surface at positions which electrodes of the integrated circuit are connected to. An elastic member is provided beneath the second surface of the base opposite to the first surface, the elastic member having a first level of hardness. A flexible film member is provided between the second surface of the base and the elastic member, the film member having a second level of hardness higher than the first level of hardness of the elastic member.

13 Claims, 6 Drawing Sheets

INTEGRATED CIRCUIT TESTING DEVICE

BACKGROUND OF THE INVENTION (1) Field of the Invention

The present invention relates to an integrated circuit testing device and method used to electrically test an integrated circuit of large-scale integration or printed circuit boards with electrodes of the integrated circuit being electrically connected to contacts of the integrated circuit testing device.

Recently, there has been an increasing demand for integrated circuits having a smaller size, a higher operating speed and a higher integrated level. In conformity with this demand, it is necessary to achieve fine-pitch interconnects of electrodes or bumps on the integrated circuit chip. Hence, it is desired to provide an integrated circuit testing device which is used for electrical testing of such an integrated circuit having fine-pitch interconnects of the electrodes and which assures the reliability of electric connections between the integrated circuit chip and the testing device. When testing the integrated circuit chip, it is required that the integrated circuit testing device assures the reliability of electric connections between the electrodes of the integrated circuit and the contacts of the integrated circuit testing device.

(2) Description of the Related Art

FIG. 11 shows a configuration of a conventional integrated circuit testing device.

The conventional integrated circuit testing device of FIG. 11 is also called a membrane-type contacter. The integrated circuit testing device of this type includes projecting contacts which are provided on a wiring layer of a flexible base as the membrane contacts.

A method of electrically testing an integrated circuit by using a plurality of probes brought into contact with the bumps of the integrated circuit chip is known. When the known method is carried out with an integrated circuit having a variety of heights of the bumps on the integrated circuit chip, it is difficult for the known method to attain an adequately high level of accuracy of the testing while retaining good electrical connections between the probes and the bumps of the chip. If the integrated circuit has fine-pitch interconnects of the bumps, it is necessary to make the distances between the probes as small as possible in conformity with the fine-pitch interconnects of the integrated circuit chip. However, if the distances between the probes placed on the chip are too small, interference between the probes is likely to take place during the testing. Therefore, it is difficult for the known method to attain an adequately high level of accuracy of the testing while retaining good electrical connections between the probes and the bumps.

As shown in FIG. 11, the conventional integrated circuit testing device 1 includes a wiring layer 4 of a conductive material formed on a flexible base 2 of an insulating material such as a polyimide resin. A plurality of projecting contacts 6 are provided on the wiring layer 4 at predetermined positions to which the integrated circuit is connected.

In the conventional integrated circuit testing device 1 (hereinafter, called the testing device 1), the flexible base 2 is supported by an elastic member 8 of an elastic material such as a silicon rubber. The flexible base 2 is usually bonded to the elastic member 8 by an adhesive agent. The bottoms of the projecting contacts 6 are supported by the elastic member 8. The projecting contacts 6 constitute the membrane contacts.

A semiconductor chip 10, which includes the integrated circuit to be tested, is face-down bonded to the testing device 1 so that it is electrically connected to the projecting contacts 6 of the testing device 1. The chip 10 has a plurality of electrodes 12 formed on the back surface of the chip 10 at predetermined positions, and the electrodes 12 are bonded to the projecting contacts 6 of the testing device 1 by applying pressure thereto so as to establish the electrical connections between the electrodes 12 and the projecting contacts 6.

The above membrane-type testing device 1 has the potential to achieve a comparatively fine pitch configuration of the projecting contacts 6 when compared with other existing testing devices, and this enables the testing device 1 to keep up with the fine-pitch interconnects of the electrodes of recent integrated circuits.

The above-described testing device 1 is constructed such that, even if the heights of the projecting contacts 6 on the flexible base 2 vary or if the chip 10 is face-down bonded in an inclined position to the flexible base 2, such variations of the heights of the projecting contacts 6 can be absorbed with elastic deformation of the elastic member 8, so as to establish electrical connections between the projecting contacts 6 and the electrodes 12.

However, in the above-described testing device 1, the flexible base 2 is fixed directly to the top of the elastic member 8. There is a problem of the above-described testing device 1 which will now be described in the following.

FIG. 12A and FIG. 12B are diagrams for explaining a problem of the conventional integrated circuit testing device of FIG. 11.

As shown in FIG. 12A, a downward pressure is applied to the chip 10 after the chip 10 is placed on the flexible base 2 of the testing device 1, in order to establish electrical connections between the projecting contacts 6 and the electrodes 12.

However, as shown in FIG. 12B, the elastic member 8 may be excessively deformed by the pressure, and this causes the projecting contacts 6 to be stuck into the flexible base 2. In this condition, the portions of the back surface of the chip 10, other than the electrodes 12, are brought into contact with the testing device 1. This problem is more likely to occur when burn-in operations for the chip 10 are performed. When the chip 10 is placed in a heated condition during the testing, the elastic member 8 is likely to soften, and the elastic member 8 is excessively deformed by the pressure applied.

As described above, if the projecting contacts 6 are stuck into the flexible base 2, the portions of the back surface of the chip 10 are brought into contact with the testing device 1. The undesired contact between the back surface of the chip 10 and the testing device 1 affects the electrical connections between the projecting contacts 6 and the electrodes 12, and makes it difficult to assure the reliability of electric connections between the chip 10 and the testing device 1.

On the back surface of the chip 10, the integrated circuit is formed with the electrodes 12. If the back surface of the chip 10 is brought into contact with the testing device 1 as described above, the integrated circuit on the chip 10 is affected by the testing device 1. The undesired contact between the back surface of the chip 10 and the testing device 1 may cause the integrated circuit of the chip 10 to be damaged or malfunctioning.

Further, when the chip 10 is tested by placing the chip 10 in a heated condition (for example, burn-in operations), the elastic member 8 is subjected to a large thermal expansion.

However, the flexible base 2 is fixed directly to the top of the elastic member 8. As a result, in the heated condition, the flexible base 2 is expanded due to the thermal expansion of the elastic member 8. A stress that affects the electrical connections between the projecting contacts 6 and the electrodes 12 is created by the expansion of the flexible base 2. In the worst case, flaking or separation in the connections between the projecting contacts 6 and the electrodes 12 is caused.

SUMMARY OF THE INVENTION

An object of the present invention is to provide an improved integrated circuit testing device and method in which the above-mentioned problems are eliminated.

Another object of the present invention is to provide an integrated circuit testing device which assures the reliability of electric connections between the electrodes of the integrated circuit and the projecting contacts of the testing device even when the elastic member is thermally expanded in the presence of heat.

Still another object of the present invention is to provide an integrated circuit testing method which assures the reliability of electrical connections between the electrodes of the integrated circuit and the projecting contacts of the testing device even when the elastic member is thermally expanded in the presence of heat.

The above-mentioned objects of the present invention are achieved by an integrated circuit testing device for testing an integrated circuit, including: a flexible base of an insulating material, the base having a first surface and a second surface opposite to each other, the integrated circuit being bonded to the first surface; a conductive wiring layer which is provided on the first or second surface of the base, the wiring layer including a plurality of projecting contacts over the first surface at positions which electrodes of the integrated circuit are connected to; an elastic member which is provided beneath the second surface of the base opposite to the first surface, the elastic member having a first level of hardness; and a flexible film member which is provided between the second surface of the base and the elastic member, the film member having a second level of hardness higher than the first level of hardness of the elastic member.

The above-mentioned objects of the present invention are achieved by a method of testing an integrated circuit by using an integrated circuit testing device, the testing device including: a flexible base of an insulating material, the base having a first surface and a second surface opposite to each other, the integrated circuit being bonded to the first surface; a conductive wiring layer provided on the first or second surface of the base, the wiring layer including a plurality of projecting contacts over the first surface at positions which electrodes of the integrated circuit are connected to; an elastic member provided beneath the second surface of the base opposite to the first surface, the elastic member having a first level of hardness; and a flexible film member provided between the second surface of the base and the elastic member, the film member having a second level of hardness higher than the first level of hardness of the elastic member, the method comprising the steps of: positioning the integrated circuit to the testing device so that the positions of the electrodes on the integrated circuit match the positions of the contacts on the wiring layer; applying a downward pressure to the integrated circuit so that the integrated circuit is face-down bonded to the testing device, the electrodes being pressed onto the contacts of the testing device to establish electrical connections between the contacts and the electrodes; and electrically testing the integrated circuit by using the testing device, the film member, provided between the second surface of the base and the elastic member, acting to absorb a pressure exerted on the integrated circuit during the testing.

In the integrated circuit testing device and method of a preferred embodiment of the present invention, the hardness of the film member is kept at the level higher than the hardness of the elastic member even when the integrated circuit is placed in a heated condition. Hence, the testing device according to the present invention is effective in preventing the back surface of the integrated circuit chip, other than the electrodes, from contacting the testing device when the pressure is exerted on the chip. It is possible for the testing device of the present invention to avoid the damage or malfunctioning of the integrated circuit.

In the integrated circuit testing device and method of a preferred embodiment of the present invention, the film member has a thermal expansion coefficient smaller than a thermal expansion coefficient of the elastic member. The amount of thermal expansion of the film member when the integrated circuit is placed in a heated condition is relatively small. The flexible base and the film member are not fixed to each other, and the film member and the elastic member are not fixed to each other. Hence, the thermal expansion of the elastic member does not affect the electrical connections between the projecting contacts and the electrodes. It is possible for the testing device of the present invention to assure the reliability of electric connections between the integrated circuit and the testing device.

BRIEF DESCRIPTION OF THE DRAWINGS

Other objects, features and advantages of the present invention will become more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 1:
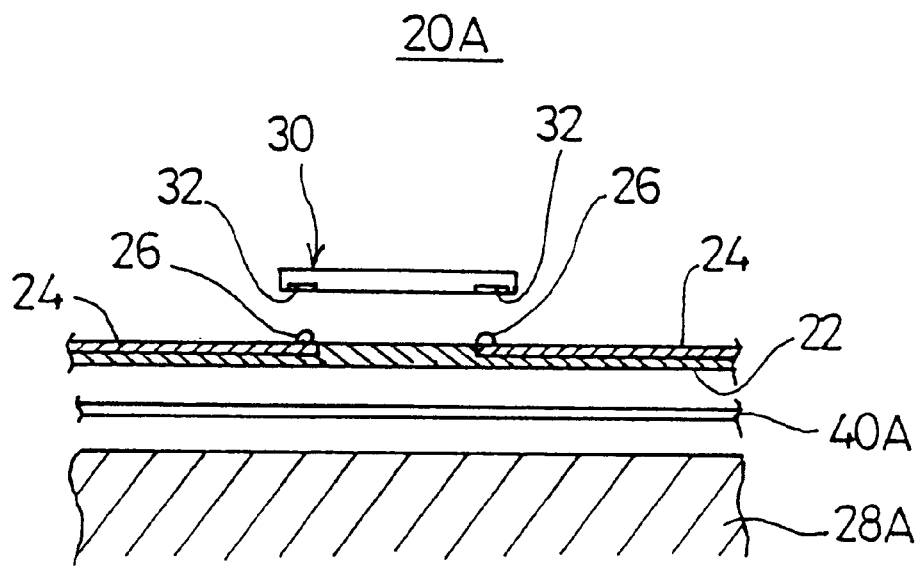
FIG. 1 is a diagram for explaining a configuration of a first embodiment of an integrated circuit testing device of the present invention.

FIG. 1 shows a configuration of a first embodiment of an integrated circuit testing device of the present invention.

As shown in FIG. 1, an integrated circuit testing device 20A (hereinafter, called the testing device 20A) of the present embodiment generally has a flexible base 22, a wiring layer 24, projecting contacts 26, an elastic member 28A, and a flexible film member 40A. A semiconductor chip 30 (hereinafter, called the chip 30), which includes an integrated circuit being tested, is face-down bonded to the testing device 20A. The testing device 20A is used when performing a function test or a reliability test of the chip 30.

In the present embodiment, the semiconductor chip 30 is of a bare-chip type with no package which encapsulates the semiconductor chip.

However, the present invention is not limited to the bare-chip type but it is applicable to semiconductor chips of types different from the bare-chip type in the present embodiment.

The flexible base 22 is made of an insulating material. More specifically, the flexible base 22 in the present embodiment is prepared by using a polyimide resin, and it has a thermal expansion of 10 to 20 ppm. Further, the flexible base 22 has a thickness W1 that is predetermined from a range of thicknesses so as to meet the formulas: (W2/2)≦W1 ≦W2 where W2 indicates a thickness of the film member 40A.

The wiring layer 24 includes a pattern of metal conductors deposited on the flexible base 22. A plurality of projecting contacts 26 are formed on the wiring layer 24 at predetermined positions which electrodes 32 of the chip 30 are connected to. The projecting contacts 26 are made of, for example, a solder. The positions of the projecting contacts 26 on the wiring layer 24 are predetermined such that they correspond to positions of the electrodes 32 of the chip 30. Further, the wiring layer 24 has a thickness W3 that is predetermined from a range of thicknesses so as to satisfy the formulas: (W2/2)≦W3 ≦W2 where W2 indicates a thickness of the film member 40A.

The elastic member 28A is made of an elastic material (for example, a silicon rubber). The elastic member 28A is provided on the back surface of the flexible base 22 opposite to the top surface thereof to which the chip 30 is bonded. More specifically, the elastic member 28A in the present embodiment is prepared by using a silicon rubber, and it has a thermal expansion of 100 ppm or above, and has a hardness of 50.

In the above-described embodiment of FIG. 1, the wiring layer 24 is provided on the top surface of the flexible base 22. Alternatively, the wiring layer 24 may be provided on the back surface of the flexible base 22 opposite to the top surface thereof in the integrated circuit testing device according to the present invention.

The testing device 20A of the present embodiment is characterized by the use of the film member 40A. The film member 40A in the present embodiment is prepared by using a flexible, film-like polyimide material. The film member 40A has a thermal expansion coefficient, a surface friction coefficient and a hardness which are equivalent to corresponding physical properties of the flexible base 22.

In the testing device 20A of the present embodiment, the film member 40A has a level of hardness higher than the level of hardness of the elastic member 28A, and has a thermal expansion coefficient smaller than the thermal expansion coefficient of the elastic member 28A. The flexible base 22 on which the wiring layer 24 is deposited, the film member 40A, and the elastic member 28A are arranged together in this order. The flexible base 22 and the film member 40A are not fixed to each other, and the film member 40A and the elastic member 28A are not fixed to each other.

Figure 2:
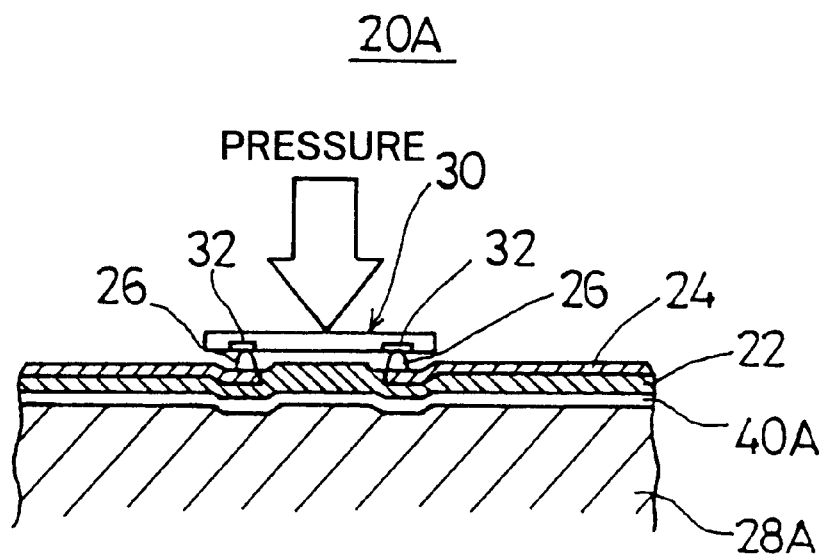
FIG. 2 is a diagram for explaining a condition of the integrated circuit testing device of FIG. 1 in which a semiconductor chip is bonded to the integrated circuit testing device.

FIG. 2 is a diagram for explaining a condition of the integrated circuit testing device 20A of FIG. 1 in which the semiconductor chip 30 is bonded to the integrated circuit testing device 20A.

Before the chip 30 is face-down bonded to the testing device 20A, the chip 30 is positioned to the testing device 20A so that the positions of the electrodes 32 on the chip 30 match the positions of the projecting contacts 26 on the wiring layer 24.

After the positioning of the chip 30 is performed, a downward pressure is applied to the chip 30 by using a pressure supplying device (not shown) so that the chip 30 is face-down bonded to the testing device 20A. As shown in FIG. 2, the electrodes 32 of the chip 30 are pressed onto the projecting contacts 26 of the testing device 20A to establish electrical connections between the projecting contacts 26 and the electrodes 32. The testing device 20A in this condition is used to electrically test the semiconductor chip 30.

As previously described, if the elastic member 28A is excessively deformed by the pressure exerted before testing the chip 30, the back surface of the chip 30, other than the electrodes 32, may be brought into contact with the testing device 20A.

However, in the testing device 20A of the present embodiment, the film member 40A is interposed between the flexible base 22 and the elastic member 28A, and the film member 40A has a level of hardness higher than the level of hardness of the elastic member 28A. Hence, even when the chip 30 is placed in a heated condition during the testing and the elastic member 28A softens or is thermally expanded, the pressure exerted on the chip 30 is absorbed by the film member 40A between the flexible base 22 and the elastic member 28A, and the testing device 20A of the present embodiment is effective in preventing the projecting contacts 26 from being stuck into the flexible base 22.

In the present embodiment, the hardness of the film member 40A is kept at the level higher than the hardness of the elastic member 28A even when the chip 30 is placed in a heated condition. Hence, the testing device 20A of the present embodiment is effective in preventing the back surface of the chip 30, other than the electrodes 32, from contacting the testing device 20A when the pressure is exerted on the chip 30. It is possible for the testing device 20A of the present embodiment to avoid the damage or malfunctioning of the integrated circuit of the chip 30.

In the present embodiment, the film member 40A has a thermal expansion coefficient smaller than the thermal expansion coefficient of the elastic member 28A. The amount of thermal expansion of the film member 40A when the chip 30 is placed in a heated condition is relatively small.

The flexible base 22 and the film member 40A are not fixed to each other, and the film member 40A and the elastic member 28A are not fixed to each other. Hence, the thermal expansion of the elastic member 28A does not affect the electrical connections between the projecting contacts 26 and the electrodes 32. It is possible for the testing device 20A of the present embodiment to assure the reliability of electric connections between the chip 30 and the testing device 20A.

Figure 3:
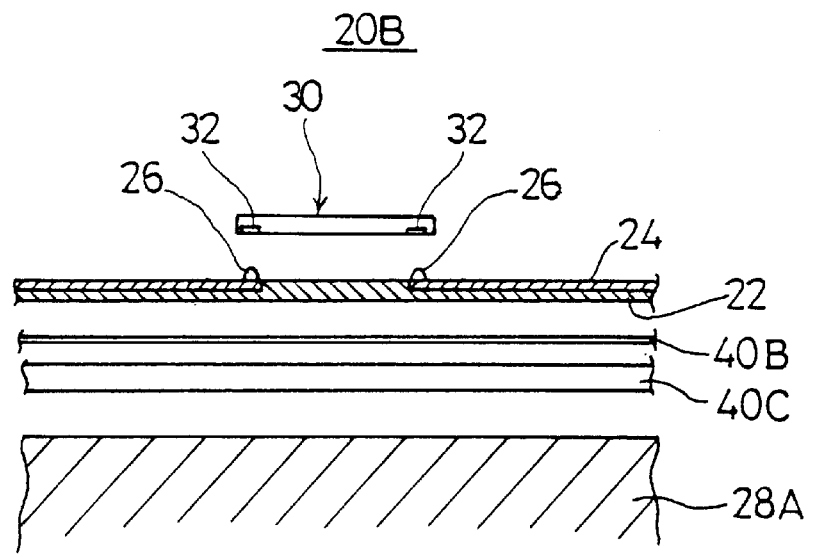
FIG. 3 is a diagram for explaining a configuration of a second embodiment of the integrated circuit testing device of the present invention.

Next, FIG. 3 shows a configuration of a second embodiment of the integrated circuit testing device of the present invention. In FIG. 3, the elements which are essentially the same as corresponding elements in FIG. 1 are designated by the same reference numerals, and a description thereof will be omitted.

As shown in FIG. 3, an integrated circuit testing device 20B (hereinafter, called the testing device 20B) of the present embodiment generally has the flexible base 22, the wiring layer 24, the projecting contacts 26, the elastic member 28A, a first film member layer 40B and a second film member layer 40C. The chip 30, which includes the integrated circuit being tested, is face-down bonded to the testing device 20B. The testing device 20B is used when performing a function test or a reliability test of the chip 30.

In the previous embodiment of FIG. 1, the film member 40A of a single layer is interposed between the flexible base 22 and the elastic member 28A. In the present embodiment, as shown in FIG. 3, the plural film member layers 40B and 40C are interposed between the flexible base 22 and the elastic member 28A.

The testing device 20B of the present embodiment is characterized by the use of the plural film member layers 40B and 40C. Each of the first and second film member layers 40B and 40C in the present embodiment is prepared by using a flexible, film-like polyimide material. Each of the first and second film member layers 40B and 40C has a thermal expansion coefficient, a surface friction coefficient and a hardness which are equivalent to corresponding physical properties of the flexible base 22.

In the present embodiment, the first film member layer 40B, which is attached to the back surface of the flexible base 22, has a thickness of 20 to 50 $\mu$m. The second film member layer 40C, which is attached to the back surface of the film member layer 40B, has a thickness of 75 to 300 $\mu$m.

By the use of the plural film member layers 40B and 40C, it is possible to select a desired hardness of the whole film member (or the film member layers 40B and 40C) with respect to the hardness of the elastic member 28A in the testing device 20B. More specifically, the hardness which is attained by the plural film member layers 40B and 40C included in the testing device 20B is higher than the hardness which is attained by only the first film member layer 40B included in the integrated circuit testing device. Hence, if the number of the film member layers included in the testing device 20B is determined in an appropriate manner, it is possible to easily select a desired hardness of the whole film member with respect to the hardness of the elastic member 28A in the testing device 20B.

In the present embodiment, the hardness of the film member layers 40B and 40C is kept at the level higher than the hardness of the elastic member 28A even when the chip 30 is placed in a heated condition. Further, as described above, it is possible to easily select a desired hardness of the whole film member. Hence, the testing device 20B of the present embodiment is more effective in preventing the back surface of the chip 30, other than the electrodes 32, from contacting the testing device 20B when the pressure is exerted on the chip 30. It is possible for the testing device 20B of the present embodiment to more effectively avoid the damage or malfunctioning of the integrated circuit of the chip 30.

In the present embodiment, each of the film member layers 40B and 40C has a thermal expansion coefficient smaller than the thermal expansion coefficient of the elastic member 28A. The amount of thermal expansion of the film member layers 40B and 40C when the chip 30 is placed in a heated condition is relatively small. The flexible base 22 and the first film member layer 40B are not fixed to each other, the first film member layer 40B and the second film member layer 40C are not fixed to each other, and the second film member layer 40C and the elastic member 28A are not fixed to each other. Hence, the thermal expansion of the elastic member 28A does not affect the electrical connections between the projecting contacts 26 and the electrodes 32. It is possible for the testing device 20B of the present embodiment to more effectively assure the reliability of electric connections between the chip 30 and the testing device 20B.

In the above-described embodiment of FIG. 3, the film member layers 40B and 40C both having the same physical properties (such as the hardness, the thermal expansion or the elasticity) are provided in the testing device 20B. However, the advantages which are the same as the advantages of the above-described embodiment may be also achieved with an integrated circuit testing device having a plurality of film member layers wherein one of the plurality of film member layers has physical properties different from physical properties of the other film member layers. For example, suppose that two film member layers having different hardnesses are provided in the testing device 20B. In such a modification, it is possible to easily select a desired hardness of the whole film member.

In a case in which two film member layers having different hardnesses are provided in the testing device 20B, it is preferred that the upper film member, which is attached to the back surface of the flexible base 22, has a level of hardness higher than a level of hardness of the lower film member, which is attached to the back surface of the upper film member. It is preferred that, in the above case, the upper film member has an elasticity coefficient lower than an elasticity coefficient of the lower film member. Further, it is preferred that, in the above case, the upper film member has a thermal expansion coefficient lower than a thermal expansion coefficient of the lower film member.

In the above-mentioned modification of the testing device 20B, by selecting the desired hardness of the plural film member layers, it is possible to effectively prevent the back surface of the chip 30, other than the electrodes 32, from contacting the testing device when the downward pressure is exerted on the chip 30. The electrical connections between the projecting contacts 26 and the electrodes 32 are not significantly affected because the plural film member layers are used. Hence, it is possible to avoid the damage or malfunctioning of the integrated circuit of the chip 30.

Figure 4:
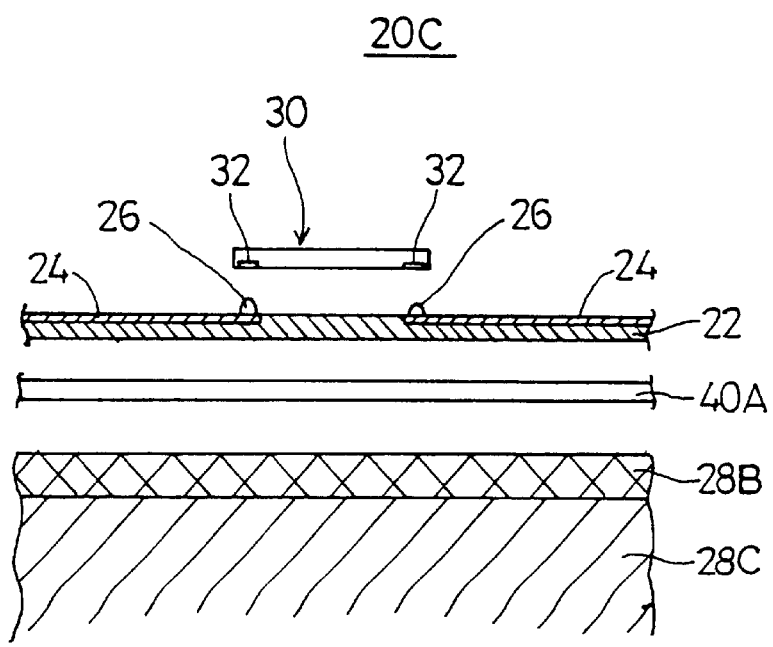
FIG. 4 is a diagram for explaining a configuration of a third embodiment of the integrated circuit testing device of the present invention.

Next, FIG. 4 shows a configuration of a third embodiment of the integrated circuit testing device of the present invention. In FIG. 4, the elements which are essentially the same as corresponding elements in FIG. 1 are designated by the same reference numerals, and a description thereof will be omitted.

As shown in FIG. 4, an integrated circuit testing device 20C (hereinafter, called the testing device 20C) of the present embodiment generally has the flexible base 22, the wiring layer 24, the projecting contacts 26, the film member 40A, a first elastic member layer 28B, and a second elastic member layer 28C. The chip 30, which includes the integrated circuit being tested, is face-down bonded to the testing device 20C. The testing device 20C is used when performing a function test or a reliability test of the chip 30.

In the previous embodiment of FIG. 1, a single-layer elastic member 28A is provided in the testing device 20A. In the present embodiment, as shown in FIG. 4, the plural elastic member layers 28B and 28C are provided in the testing device 20C.

The testing device 20C of the present embodiment is characterized by the use of the plural elastic member layers 28B and 28C. Each of the plural elastic member layers 28B and 28C in the present embodiment is prepared by using a silicon rubber. The plural elastic member layers 28B and 28C are formed into a multi-layer elastic member. In the present embodiment, the first and second film member layers 28B and 28C have different physical properties (such as the hardness, the thermal expansion or the elasticity) and they are provided in the testing device 20C.

In the present embodiment, the first elastic member layer 28B, which is attached to the back surface of the film member 40A, has a level of hardness higher than a level of hardness of the second elastic member layer 28C which is attached to the back surface of the first elastic member layer 28B. More specifically, the first elastic member layer 28B has a hardness of 80, and the second elastic member layer 28C has a hardness of 50. That is, the testing device 20C of the present embodiment is constructed such that the first elastic member layer 28B has a higher-level hardness and the second elastic member layer 28C has a lower-level hardness.

The first elastic member layer 28B with the higher-level hardness serves to absorb variations of the heights of the projecting contacts 26 and the electrodes 32, and to prevent the sticking of the projecting contacts 26 into the flexible base 22. The second elastic member layer 28C with the lower-level hardness serves to absorb an inclined condition or an impact of the chip 30 when the chip 30 is face-down bonded to the testing device 20C.

Figure 5:
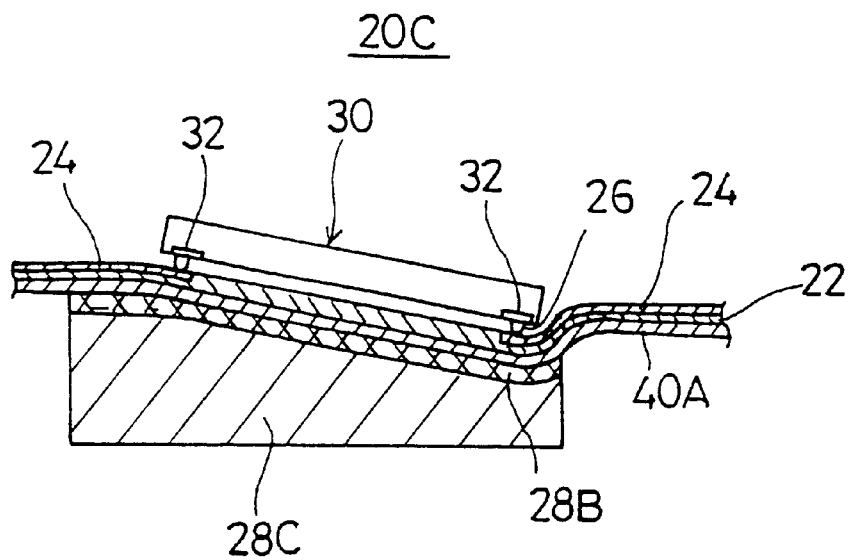
FIG. 5 is a diagram for explaining a condition of the integrated circuit testing device of FIG. 4 in which a semiconductor chip is bonded to the integrated circuit testing device.

FIG. 5 is a diagram for explaining a condition of the integrated circuit testing device 20C of FIG. 4 in which the chip 30 is bonded in an inclined condition to the testing device 20C.

As shown in FIG. 5, the inclined condition of the chip 30 is absorbed with the elastic deformation of the second elastic member layer 28C which has the lower-level hardness. Variations of the heights of the projecting contacts 26 and the electrodes 32 are absorbed with the elastic deformation of the first elastic member layer 28B which has the higher-level hardness. Further, the first elastic member layer 28B with the high-level hardness serves to prevent the sticking of the projecting contacts 26 into the flexible base 22.

In the present embodiment, the first and second elastic member layers 28B and 28C have different physical properties (such as the hardness, the thermal expansion or the elasticity) and they are provided in the testing device 20C so as to effect the above functions of the individual elastic member layers. It is possible for the testing device 20C of the present embodiment to more effectively assure the reliability of electric connections between the chip 30 and the testing device 20C.

In the above-described embodiment, each of the first and second elastic member layers 28B and 28C is prepared by using the same material (or the silicon rubber). However, it is not necessarily required to use the same material for the first and second elastic member layers 28B and 28C. According to the present invention, it is possible to use different materials for the plural elastic member layers.

Figure 6:
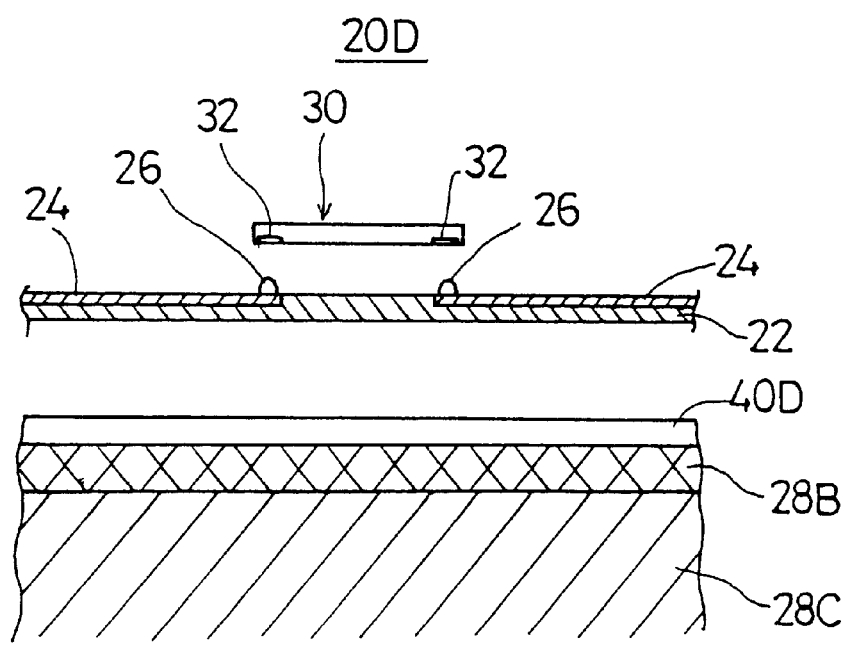
FIG. 6 is a diagram for explaining a configuration of a fourth embodiment of the integrated circuit testing device of the present invention.

Next, FIG. 6 shows a configuration of a fourth embodiment of the integrated circuit testing device of the present invention. In FIG. 6, the elements which are essentially the same as corresponding elements in FIG. 4 are designated by the same reference numerals, and a description thereof will be omitted.

As shown in FIG. 6, an integrated circuit testing device 20D (hereinafter, called the testing device 20D) of the present embodiment generally has the flexible base 22, the wiring layer 24, the projecting contacts 26, and a film member 40D to which the elastic member layers 28B and 28C are attached. The chip 30, which includes the integrated circuit being tested, is face-down bonded to the testing device 20D. The testing device 20D is used when performing a function test or a reliability test of the chip 30.

In the previous embodiments of FIG. 1, FIG. 3 and FIG. 4, the film member layers 40A through 40C which are separate from the elastic member layers 28A through 28C are provided. In the present embodiment, as shown in FIG. 6, the film member 40D which is integrally formed with the elastic member layers 28B and 28C is provided in the testing device 20D. The film member 40D in the present embodiment will be called the integral-type film member 40D. The testing device 20D of the present embodiment is characterized by the use of the integral-type film member 40D.

The testing device 20D of FIG. 6 is adapted in conformity with the embodiment of FIG. 4, and the film member 40D integrally formed with the elastic member layers 28B and 28C is provided. If it is adapted in conformity with the embodiment of FIG. 1, it is conceivable that the integral-type film member 40D integrally formed only with the elastic member 28A is provided in the testing device 20D.

In the present embodiment, the film member 40D integrally formed with the elastic member layers 28B and 28C is provided. According to the testing device 20D of the present embodiment, it is possible to provide a simple structure of the integrated circuit testing device and enable the productivity to be increased from the level of the productivity related to the embodiment of FIG. 4 in which the film member 40A separate from the elastic member layers 28B and 28C are provided.

The integral-type film member 40D may be prepared by using a suitable production method. For example, an insert molding method may be used. The film member 40D is first inserted in a molding die before performing the molding of the first elastic member layer 28B, and then the first elastic member layer 28B is molded together with the film member 40D in the molding die. Subsequently, the second elastic member layer 28C is molded together with the first elastic member layer 28B and the film member 40D.

Alternatively, an adhesive agent may be used so as to prepare the film member 40D which is bonded to the elastic member layer 28B by the adhesive agent and the elastic member layer 28B is bonded to the elastic member layer 28C by the adhesive agent.

Figure 7:
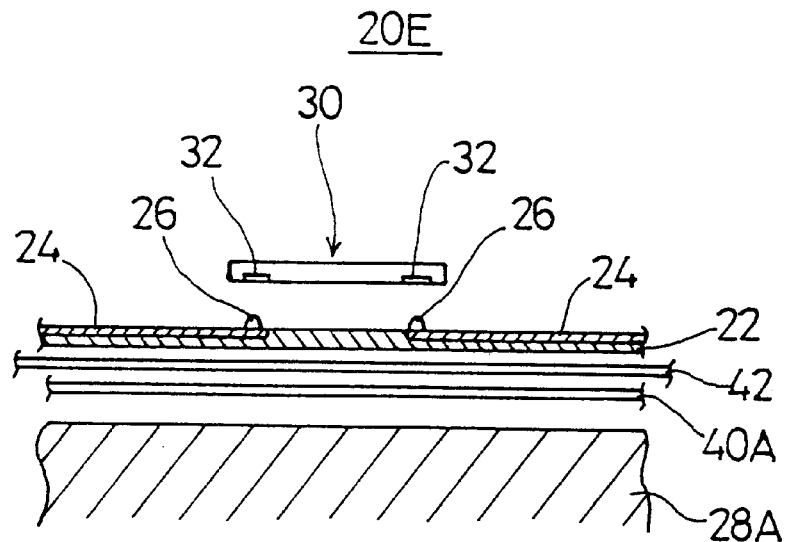
FIG. 7 is a diagram for explaining a configuration of a fifth embodiment of the integrated circuit testing device of the present invention.

Next, FIG. 7 shows a configuration of a fifth embodiment of the integrated circuit testing device of the present invention. In FIG. 7, the elements which are essentially the same as corresponding elements in FIG. 1 are designated by the same reference numerals, and a description thereof will be omitted.

As shown in FIG. 7, an integrated circuit testing device 20E (hereinafter, called the testing device 20E) of the present embodiment generally has the flexible base 22, the wiring layer 24, the projecting contacts 26, the elastic member 28A, the film member 40A, and a low-friction substance 42. The chip 30, which includes the integrated circuit being tested, is face-down bonded to the testing device 20E. The testing device 20E is used when performing a function test or a reliability test of the integrated circuit of the chip 30.

The testing device 20E of the present embodiment is characterized by the use of the low-friction substance 42. In the present embodiment, the low-friction substance 42 is provided between the flexible base 22 and the film member 40A. The low-friction substance 42 in the present embodiment is a viscous material (for example, a silicon grease). For the sake of convenience, the low-friction substance 42 is indicated as a sheet-like member in the following embodiments of FIG. 7 through FIG. 10.

In the testing device 20E of the present embodiment, as shown in FIG. 7, the low-friction substance 42 is provided between the flexible base 22 and the film member 40A, and the low-friction substance 42 improves slip of the film member 40A relative to the flexible base 22. The film member 40A smoothly slides relative to the flexible base 22 because of the use of the low-friction substance 42.

Even when the chip 30 is placed in a heated condition during the testing and the elastic member 28A softens or is thermally expanded, the film member 40A smoothly slides relative to the flexible base 22 by the use of the low-friction substance 42. Hence, the testing device 20E of the present embodiment is effective in preventing the back surface of the chip 30, other than the electrodes 32, from contacting the testing device 20E when the pressure is exerted on the chip 30. It is possible for the testing device 20E of the present embodiment to avoid the damage or malfunctioning of the integrated circuit of the chip 30. Further, it is possible for the testing device 20E of the present embodiment to effectively assure the reliability of electric connections between the chip 30 and the testing device 20E.

Figure 8:
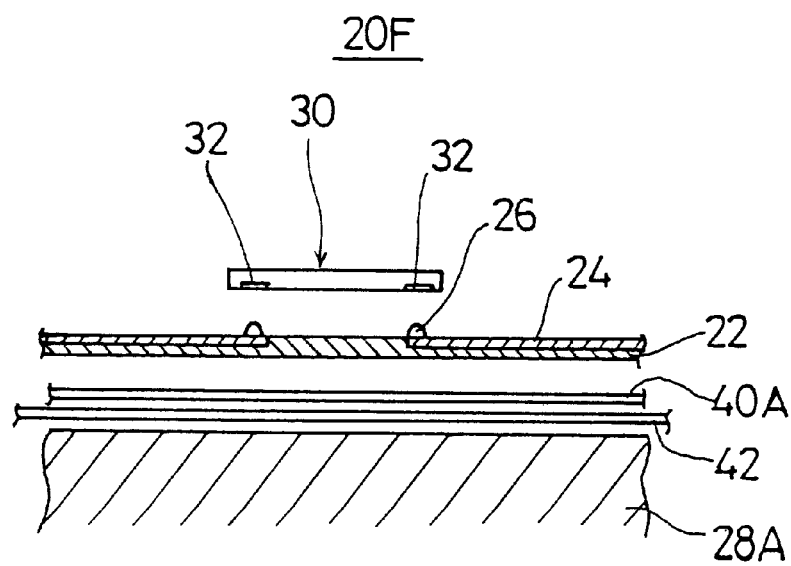
FIG. 8 is a diagram for explaining a variation of the integrated circuit testing device of FIG. 7.

FIG. 8 shows a variation of the integrated circuit testing device of FIG. 7. In FIG. 8, the elements which are essentially the same as corresponding elements in FIG. 7 are designated by the same reference numerals, and a description thereof will be omitted.

As shown in FIG. 8, an integrated circuit testing device 20F (hereinafter, called the testing device 20F) of the present embodiment generally has the flexible base 22, the wiring layer 24, the projecting contacts 26, the elastic member 28A, the film member 40A, and the low-friction substance 42. In the present embodiment, the low-friction substance 42 is provided between the film member 40A and the elastic member 28A.

The low-friction substance 42 in the present embodiment improves slip of the film member 40A relative to the elastic member 28A. The film member 40A smoothly slides relative to the elastic member 28A because of the use of the low-friction substance 42.

Even when the chip 30 is placed in a heated condition during the testing and the elastic member 28A softens or is thermally expanded, the film member 40A smoothly slides relative to the elastic member 28A by the use of the low-friction substance 42. Similar to the embodiment of FIG. 7, the testing device 20F of the present embodiment is effective in preventing the back surface of the chip 30, other than the electrodes 32, from contacting the testing device 20E when the pressure is exerted on the chip 30. It is possible for the testing device 20E of the present embodiment to avoid the damage or malfunctioning of the integrated circuit of the chip 30. Further, it is possible for the testing device 20F of the present embodiment to effectively assure the reliability of electric connections between the chip 30 and the testing device 20F.

Figure 9:
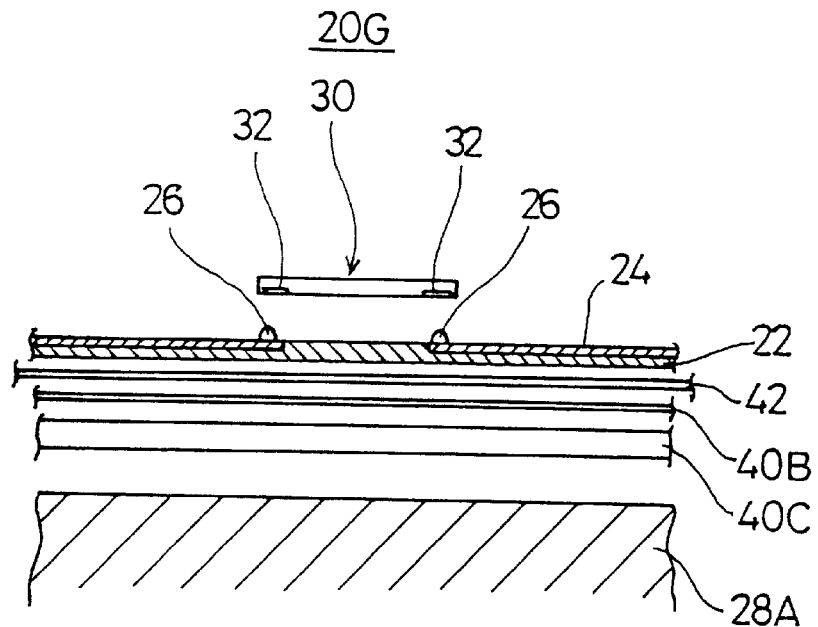
FIG. 9 is a diagram for explaining another variation of the integrated circuit testing device of FIG. 7.

FIG. 9 shows another variation of the integrated circuit testing device of FIG. 7. In FIG. 9, the elements which are essentially the same as corresponding elements in FIG. 7 are designated by the same reference numerals, and a description thereof will be omitted.

As shown in FIG. 9, an integrated circuit testing device 20G (hereinafter, called the testing device 20G) of the present embodiment generally has the flexible base 22, the wiring layer 24, the projecting contacts 26, the elastic member 28A, the film member layers 40B and 40C (which are the same as corresponding elements in FIG. 3), and the low-friction substance 42. In the present embodiment, the low-friction substance 42 is provided between the first film member layer 40B and the flexible base 22.

The low-friction substance 42 in the present embodiment improves slip of the first film member layer 40B relative to the flexible base 22. The first film member layer 40B smoothly slides relative to the flexible base 22 because of the use of the low-friction substance 42.

Even when the chip 30 is placed in a heated condition during the testing and the elastic member 28A softens or is thermally expanded, the first film member layer 40B smoothly slides relative to the flexible base 22 by the use of the low-friction substance 42. Similar to the embodiment of FIG. 7, the testing device 20G of the present embodiment is effective in preventing the back surface of the chip 30, other than the electrodes 32, from contacting the testing device 20G when the pressure is exerted on the chip 30. It is possible for the testing device 20G of the present embodiment to avoid the damage or malfunctioning of the integrated circuit of the chip 30. Further, it is possible for the testing device 20G of the present embodiment to effectively assure the reliability of electric connections between the chip 30 and the testing device 20G.

Figure 10:
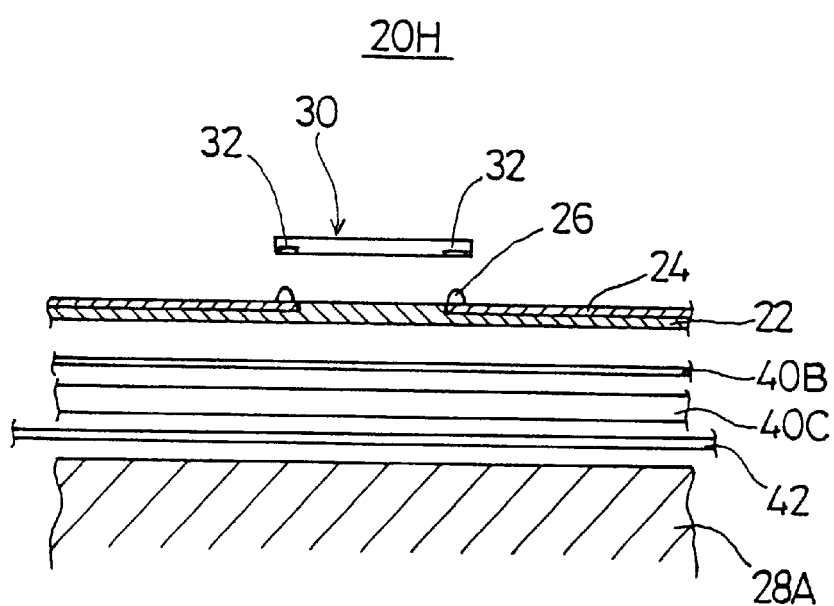
FIG. 10 is a diagram for explaining a further variation of the integrated circuit testing device of FIG. 7.
Figure 11:
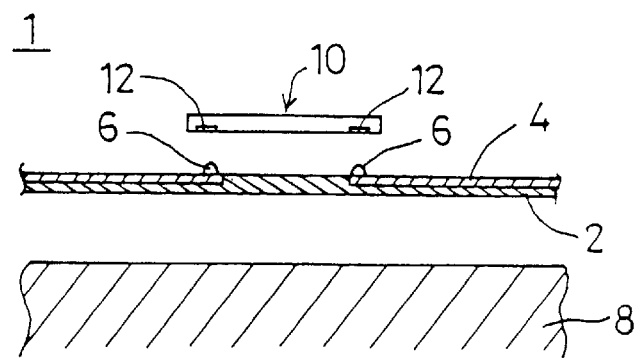
FIG. 11 is a diagram for explaining a configuration of a conventional integrated circuit testing device.
Figure 12A:
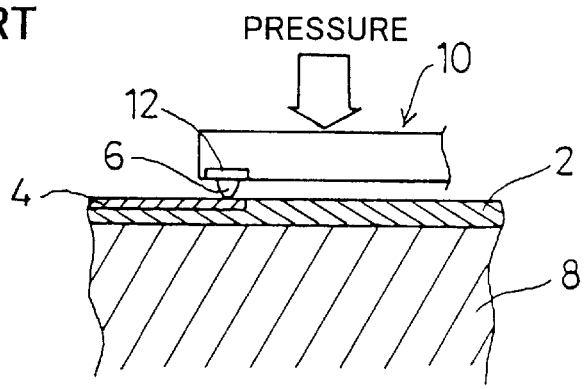
FIG. 12A and FIG. 12B are diagrams for explaining a problem of the conventional integrated circuit testing device of FIG. 11.
Figure 12B:
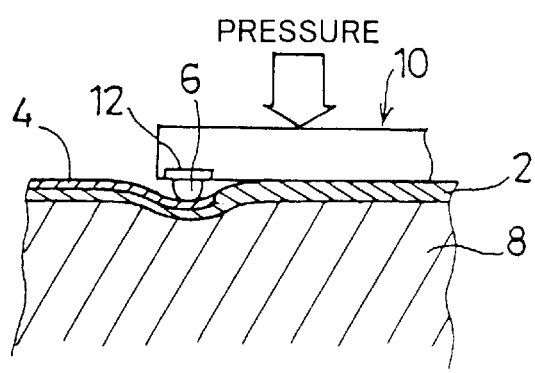

FIG. 10 shows a further variation of the integrated circuit testing device of FIG. 7. In FIG. 10, the elements which are essentially the same as corresponding elements in FIG. 7 are designated by the same reference numerals, and a description thereof will be omitted.

As shown in FIG. 10, an integrated circuit testing device 20H (hereinafter, called the testing device 20H) of the present embodiment generally has the flexible base 22, the wiring layer 24, the projecting contacts 26, the elastic member 28A, the film member layers 40B and 40C (which are the same as corresponding elements in FIG. 3), and the low-friction substance 42. In the present embodiment, the low-friction substance 42 is provided between the film member layer 40C and the elastic member 28A.

The low-friction substance 42 in the present embodiment improves slip of the film member layer 40C relative to the elastic member 28A. The film member layer 40C smoothly slides relative to the elastic member 28A because of the use of the low-friction substance 42.

Even when the chip 30 is placed in a heated condition during the testing and the elastic member 28A softens or is thermally expanded, the film member layer 40C smoothly slides relative to the elastic member 28A by the use of the low-friction substance 42. Similar to the embodiment of FIG. 7, the testing device 20H of the present embodiment is effective in preventing the back surface of the chip 30, other than the electrodes 32, from contacting the testing device 20H when the pressure is exerted on the chip 30. It is possible for the testing device 20H of the present embodiment to avoid the damage or malfunctioning of the integrated circuit of the chip 30. Further, it is possible for the testing device 20H of the present embodiment to effectively assure the reliability of electric connections between the chip 30 and the testing device 20H.

In the above-described embodiments of FIG. 7 through FIG. 10, the low-friction substance 42 which is a viscous material such as a silicon grease is provided. However, the low-friction substance 42 used by the integrated circuit testing device of the present invention is not limited to the viscous material. Alternatively, a powder material or a liquid material may instead be used as the low-friction substance 42.

In the above-described embodiments of FIG. 1 through FIG. 10, the integrated circuit testing devices include either the film member 40A or the film member layers 40B and 40C.

However, the integrated circuit testing device of the present invention is not limited to these embodiments. For example, the integrated circuit testing device of the present invention may be modified so that it includes a plurality of elastic member layers, such as the elastic member layers 28B and 28C shown in FIG. 4, but does not include any film member. In the above modification, it is necessary that one of the plurality of elastic member layers, which is attached to the back surface of the flexible base 22, has physical properties (such as the hardness, the thermal expansion, or the elasticity) different from the physical properties of the other, and the elastic member attached to the back surface of the flexible base 22 serves to effect the functions of the above-mentioned film member 40A. Similar to the embodiment of FIG. 4, the integrated circuit testing device of the above modification is effective in preventing the back surface of the chip 30, other than the electrodes 32, from contacting the testing device when the pressure is exerted on the chip 30. It is possible for the integrated circuit testing device of the above modification to avoid the damage or malfunctioning of the integrated circuit of the chip 30. Further, it is possible for the integrated circuit testing device of the above modification to effectively assure the reliability of electric connections between the chip 30 and the testing device.

Further, the present invention is based on Japanese priority application No.10-019,644, filed on Jan. 30, 1998, the entire contents of which are hereby incorporated by reference.

What is claimed is:

1. An integrated circuit testing device for testing an integrated circuit, comprising:
    a flexible base of an insulating material, the base having a first surface and a second surface opposite each other, the integrated circuit having a bottom surface bonded to the first surface;
    a conductive wiring layer provided on the first or second surface of the base, the wiring layer including a plurality of projecting contacts over the first surface at positions which electrodes of the integrated circuit are connected to;
    an elastic member provided beneath the second surface of the base opposite the first surface, the elastic member having a first level of hardness, the elastic member fully extending, without interruption, beneath the entire bottom surface of the integrated circuit including the positions where the electrodes are provided; and
    a flexible film member provided between the second surface of the base and the elastic member, the film member having a second level of hardness higher than the first level of hardness of the elastic member.

2. The integrated circuit testing device according to claim 1, wherein the elastic member has a first thermal expansion coefficient and the film member has a second thermal expansion coefficient smaller than the first thermal expansion coefficient.

3. The integrated circuit testing device according to claim 1, wherein the film member includes a plurality of film member layers interposed between the second surface of the base and the elastic member.

4. The integrated circuit testing device according to claim 3, wherein one of the plurality of film member layers, that is nearest to the base, has physical properties different from physical properties of the other film member layers.

5. The integrated circuit testing device according to claim 4, wherein said one of the plurality of film member layers and the other film member layers are different from each other in at least one of the physical properties including thickness, hardness, elasticity and thermal expansion.

6. The integrated circuit testing device according to claim 1, wherein the elastic member includes a plurality of elastic member layers provided beneath the film member, and one of the plurality of elastic member layers, that is nearest to the base, has physical properties different from physical properties of the other elastic member layers.

7. The integrated circuit testing device according to claim 6, wherein said one of the plurality of elastic member layers and the other elastic member layers are different from each other in at least one of the physical properties including hardness, elasticity and thermal expansion.

8. The integrated circuit testing device according to claim 1, further comprising a low-friction substance provided beneath the second surface of the base and above the elastic member, the low-friction substance improving slip of the film member relative to either the base or the elastic member.

9. The integrated circuit testing device according to claim 3, further comprising a low-friction substance provided beneath the second surface of the base and above the elastic member, the low-friction substance being arranged at one of a position between the second surface of the base and the film member, a position between the film member and the elastic member, and a position between the plurality of film member layers.

10. The integrated circuit testing device according to claim 1, wherein the film member is integrally formed with the elastic member.

11. An integrated circuit testing device for testing an integrated circuit, comprising:
    a flexible base of an insulating material, the base having a first surface and a second surface opposite each other, the integrated circuit having a bottom surface bonded to the first surface;
    a conductive wiring layer provided on the first or second surface of the base, the wiring layer including a plurality of projecting contact over the first surface at positions which electrodes of the integrated circuit are connected to; and
    an elastic member provided beneath the second surface of the base opposite the first surface, the elastic member fully extending, without interruption, beneath the entire bottom surface of the integrated circuit including the positions where the electrodes are provided, the elastic member including a plurality of elastic member layers beneath the second surface of the base, and one of the plurality of elastic member layers, that is nearest to the base, having physical properties different from physical properties of the other elastic member layers.

12. A method of testing an integrated circuit by using an integrated circuit testing device, the testing device including: a flexible base of an insulating material, the base having a first surface and a second surface opposite each other, the integrated circuit having a bottom surface bonded to the first surface; a conductive wiring layer provided on the first or second surface of the base, the wiring layer including a plurality of projecting contacts over the firs surface at positions which electrodes of the integrated circuit are connected to; an elastic member provided beneath the second surface of the base opposite the first surface, the elastic member fully extending, without interruption, beneath the entire bottom surface of the integrated circuit including the positions where the electrodes are provided, the elastic member having a first level of hardness; and a flexible film member provided between the second surface of the base and the elastic member, the film member having a second level of hardness higher than the first level of hardness of the elastic member, said method comprising the steps of:

positioning the integrated circuit to the testing device so that the positions of the electrodes on the integrated circuit match the positions of the contacts on the wiring layer;

applying a downward pressure to the integrated circuit so that the integrated circuit is face-down bonded to the testing device, the electrodes being pressed onto the contacts of the testing device to establish electrical connections between the contacts and the electrodes; and electrically testing the integrated circuit by using said testing device, the film member, provided between the second surface of the base and the elastic member, acting to absorb a pressure exerted on the integrated circuit during the testing.

13. A method of testing an integrated circuit by using an integrated circuit testing device, the testing device including: a flexible base of an insulating material, the base having a first surface and a second surface opposite each other, the integrated circuit having a bottom surface bonded to the first surface; a conductive wiring layer provided on the first or second surface of the base, the wiring layer including a plurality of projecting contacts over the first surface at positions which electrodes of the integrated circuit are connected to; and an elastic member provided beneath the second surface of the base opposite the first surface, the elastic member fully extending, without interruption, beneath the entire bottom surface of the integrated circuit including the positions where the electrodes are provided, the elastic member including a plurality of elastic member layers beneath the second surface of the base, and one or the plurality of elastic member layers, that is nearest to the base, having physical properties different from physical properties of the other elastic member layers, said method comprising the steps of:

positioning the integrated circuit to the testing device so that the positions of the electrodes on the integrated circuit match the positions of the contacts on the wiring layer;

applying a downward pressure to the integrated circuit so that the integrated circuit is face-down bonded to the testing device, the electrodes being pressed onto the contacts of the testing device to establish electrical connections between the contacts and the electrodes; and electrically testing the integrated circuit by using said testing device, the elastic member, provided beneath the second surface of the base opposite to the first surface, acting to absorb a pressure exerted on the integrated circuit during the testing.

* * * * *